United States Patent
Matsumoto et al.

(10) Patent No.: US 8,877,004 B2
(45) Date of Patent: Nov. 4, 2014

(54) PLASMA PROCESSING APPARATUS AND PLASMA PROCESSING METHOD

(75) Inventors: Naoki Matsumoto, Hyogo (JP); Kazuyuki Kato, Hyogo (JP); Masafumi Shikata, Hyogo (JP); Masaru Sasaki, Hyogo (JP)

(73) Assignee: Tokyo Electron Limited, Tokyo (JP)

( * ) Notice: Subject to any disclaimer, the term of this patent is extended or adjusted under 35 U.S.C. 154(b) by 698 days.

(21) Appl. No.: 12/866,545

(22) PCT Filed: Feb. 6, 2009

(86) PCT No.: PCT/JP2009/052062
§ 371 (c)(1),
(2), (4) Date: Nov. 4, 2010

(87) PCT Pub. No.: WO2009/099186
PCT Pub. Date: Aug. 13, 2009

(65) Prior Publication Data
US 2011/0039417 A1    Feb. 17, 2011

(30) Foreign Application Priority Data
Feb. 8, 2008   (JP) .................... 2008-029178

(51) Int. Cl.
*C23C 16/00* (2006.01)
*C23F 1/00* (2006.01)
*H01L 21/306* (2006.01)
*H01J 37/32* (2006.01)
*H05H 1/46* (2006.01)

(52) U.S. Cl.
CPC ............ *H05H 1/46* (2013.01); *H01J 37/32192* (2013.01); *H01J 37/32238* (2013.01)
USPC ........... 156/345.41; 118/723 MW; 118/723 R

(58) Field of Classification Search
CPC .................................................. H01J 37/32238
USPC .................. 156/345.41; 118/723 R, 723 MW
See application file for complete search history.

(56) References Cited

U.S. PATENT DOCUMENTS 6,953,908 B2 * 10/2005 Ishii et al. ................. 219/121.43
7,374,620 B2 *  5/2008 Ohmi et al. .................... 118/715
(Continued)

FOREIGN PATENT DOCUMENTS

JP          07-029890 A       1/1995
JP         2005-268763    *  9/2005  .............. H01L 21/31
(Continued)

OTHER PUBLICATIONS

International Search Report for PCT/JP2009/052062 dated Apr. 21, 2009.
(Continued)

Primary Examiner — Rakesh Dhingra
(74) Attorney, Agent, or Firm — Pearne & Gordon LLP

(57) ABSTRACT

A dielectric plate 20 is provided at a ceiling surface facing a susceptor 3 of a processing chamber 2, and a slot antenna 30 having a multiple number of microwave transmissive slots 33 is provided on a top surface of the dielectric plate 20. A protrusion member 21 configured as a separate member from the dielectric plate 20 is provided on a peripheral portion of a bottom surface of the dielectric plate 20 so as to prevent an abnormal electric discharge. Electric field intensity in the vicinity of the dielectric plate 20 is controlled by adjusting a gap between an outer peripheral surface 22 of a cylindrical part of the protrusion member 21 and an inner peripheral surface 5a of a sidewall of the processing chamber 2 or by adjusting a thickness of the cylindrical part of the protrusion member 21.

4 Claims, 5 Drawing Sheets

(56) References Cited

U.S. PATENT DOCUMENTS

| | | | |
|---|---|---|---|
| 8,006,640 B2 * | 8/2011 | Sasaki | 118/723 AN |
| 2006/0213436 A1 * | 9/2006 | Ohmi et al. | 118/715 |
| 2007/0264441 A1 | 11/2007 | Ishibashi et al. | |
| 2009/0050052 A1 * | 2/2009 | Tian et al. | 118/50.1 |

FOREIGN PATENT DOCUMENTS

| | | |
|---|---|---|
| JP | 2005-268763 A | 9/2005 |
| JP | 2007-184292 A | 7/2007 |
| JP | 2007-188722 A | 7/2007 |
| JP | 2007/091435 A1 | 8/2007 |
| JP | 2007-214211 A | 8/2007 |
| TW | 200522801 A | 7/2005 |
| WO | 2007/091435 A1 | 8/2007 |

OTHER PUBLICATIONS

Korean Office action for 10-2010-7017481 dated Oct. 18, 2011.
Espacenet document of US 2009/050052, published Aug. 16, 2007, which corresponds to WO 2007/091435.

* cited by examiner

DISTANCE (mm) FROM CENTER OF DIELECTRIC PLATE

DISTANCE (mm) FROM CENTER OF DIELECTRIC PLATE

PLASMA PROCESSING APPARATUS AND PLASMA PROCESSING METHOD

TECHNICAL FIELD

The present invention relates to a plasma processing apparatus and a plasma processing method for performing, e.g., a CVD process or an etching process on a semiconductor substrate in a processing chamber by using plasma generated within the processing chamber.

BACKGROUND ART

As disclosed in, e.g., Japanese Patent Laid-open Publication No. 2005-268763, a plasma processing apparatus using a microwave has a flat dielectric plate made of, e.g., ceramic or quartz and configured to hermetically cover a top opening of a processing chamber. A peripheral portion of the dielectric plate is supported by a support protruding from an inner peripheral surface of a sidewall of the processing chamber. Installed on a top surface of the dielectric plate is, e.g., a metal plate called a slot antenna provided with a multiple number of slots (lengthwise openings) or holes (circular openings). A microwave is supplied to above the dielectric plate, and an electric field is generated below the dielectric plate by the microwave that has leaked through the slots or holes. Then, a processing gas introduced into the processing chamber is excited into plasma by the electric field, and a plasma process is carried out by the plasma.

In such a plasma generation method by the microwave excitation, however, a strong electromagnetic standing wave is generated within the dielectric plate. Especially, high energy plasma tends to be generated at a contact point between the dielectric plate and the support for supporting the dielectric plate, e.g., at a peripheral portion of the support on the inner side of the processing chamber due to a strong electric field. To elaborate the reason for this phenomenon, since a microwave electric field is strong in a region in the vicinity of the dielectric plate, an electron temperature of the plasma increases. If an interface exists in that region, an electric potential difference increases, and, thus, ion irradiation energy to that surface also increases.

As a result, a member near the contact point may be sputtered by the plasma, and sputtered particles may be adhered to the substrate as a processing target object, thereby causing non-uniformity of a processing rate of the processing target object or degradation of a processed material. Further, a plasma property such as radical temperature, plasma density or electron temperature in the vicinity of the contact point may be different from that at the dielectric plate's portions other than the vicinity of the contact point, which results in non-uniform plasma processing.

To solve this problem, in Japanese Patent Laid-open Publication No. 2005-268763, the dielectric plate includes a protruding portion facing the inner peripheral surface of the sidewall with a gap of a preset length provided between the protruding portion and the inner peripheral surface of the sidewall extending from the support. This protruding portion is also called a skirt portion and it is formed as one body with the dielectric plate. That is, the protruding portion is formed by downwardly extending a part of a bottom surface of the dielectric plate. Generation of a strong electric field and high density plasma in the vicinity of the contact point between the dielectric plate and the support for supporting the dielectric plate can be suppressed by providing the gap between the skirt portion and the support.

However, an abnormal electric discharge may be generated between the skirt portion and the support at a certain pressure. Although the skirt portion has a function of suppressing generation of a strong electric field and high-density plasma as mentioned above, an abnormal electric discharge may be generated in the gap between the skirt portion and the support. The reason for this is deemed to be as follows. Since the dielectric plate including the skirt portion is configured as a single body, a portion directly under the dielectric plate and the skirt portion may have the same electric potential. A microwave power is excessively supplied to high-density plasma generated directly under the dielectric plate, and, thus, the abnormal electric discharge is generated between an outer peripheral surface of the skirt portion and the inner peripheral surface of the sidewall of the support, thereby consuming the microwave power. Since an electric discharge may occur in Ar plasma, the abnormal electric discharge needs to be prevented.

DISCLOSURE OF THE INVENTION

In view of the foregoing, the present invention provides a plasma processing apparatus and a plasma processing method capable of preventing an abnormal electric discharge.

In accordance with one aspect of the present invention, there is provided a plasma processing apparatus including: a processing chamber having a top opening; a holding table that holds a processing target substrate within the processing chamber; a dielectric plate provided to close the top opening of the processing chamber and configured to face the holding table; an antenna that supplies a microwave to the dielectric plate and generates plasma on a bottom surface of the dielectric plate; and a protrusion member formed as a separate member from the dielectric plate and provided at a peripheral portion of the bottom surface of the dielectric plate while a gap is provided between an inner peripheral surface of a sidewall of the processing chamber and the protrusion member.

By configuring the protrusion member as a separate member from the dielectric plate, a surface potential between the dielectric plate and the protrusion member can be decreased. Thus, a microwave voltage propagated to the protrusion member can be reduced. Further, since the protrusion member is configured as the separate member, only the protrusion member can be easily replaced when it is worn out. Thus, cost of consumable can be reduced.

Desirably, the dielectric plate may have a plane view of a circle, and the protrusion member may have a cylindrical part; and a flange part extended outward from an upper end of the cylindrical part in a diametric direction and in contact with the peripheral portion of the bottom surface of the dielectric plate.

Desirably, a distance d between an outer peripheral surface of the cylindrical part and the inner peripheral surface of the sidewall of the processing chamber may be set to be in a range of 2.5 mm≤d≤5 mm. Further, a thickness t of the cylindrical part may be set to be in a range of 3 mm≤t≤8 mm. Furthermore, the processing chamber may have a vertical part having a preset height on the inner peripheral surface of the sidewall thereof, and a protruding length L of the cylindrical part may be set to cover the vertical part of the inner peripheral surface of the sidewall of the processing chamber.

With these configurations, electric field intensity at the peripheral portion of the dielectric plate can be controlled.

Desirably, a recess or a protrusion may be concentrically provided on the bottom surface of the dielectric plate.

By providing the recess or the protrusion, there can be generated a difference in electric field intensity of plasma generated on the bottom surface of the dielectric plate. Thus, plasma density above the processing target substrate can be controlled.

In accordance with another aspect of the present invention, there is provided a plasma processing method including: preparing a processing chamber having a top opening, a holding table that holds a processing target substrate within the processing chamber, a dielectric plate provided to close the top opening of the processing chamber and configured to face the holding table, an antenna that supplies a microwave to the dielectric plate and generates plasma on a bottom surface of the dielectric plate, and a protrusion member formed as a separate member from the dielectric plate and provided at a peripheral portion of the bottom surface of the dielectric plate while a gap is provided between an inner peripheral surface of a sidewall of the processing chamber and the protrusion member; and controlling electric field intensity in the vicinity of the dielectric plate by adjusting the gap between the inner peripheral surface of the sidewall of the processing chamber and the protrusion member, and an outer peripheral surface of the protrusion member.

In accordance with the present invention, by providing the protrusion member at the peripheral portion of the bottom surface of the dielectric plate for the purpose of preventing an abnormal electric discharge and configuring the protrusion member as a separate member from the dielectric plate, a surface potential between the dielectric plate and the protrusion member can be decreased, and, thus, a microwave voltage propagated to the protrusion member can be reduced. Therefore, an abnormal electric discharge can be suppressed, and electric field intensity in the vicinity of a contact point between the dielectric plate and the processing chamber can also be reduced. Further, since the protrusion member is configured as a separate member, only the protrusion member can be easily replaced when it is worn out. Thus, cost of consumable can be reduced.

BEST MODE FOR CARRYING OUT THE INVENTION

Figure 1:
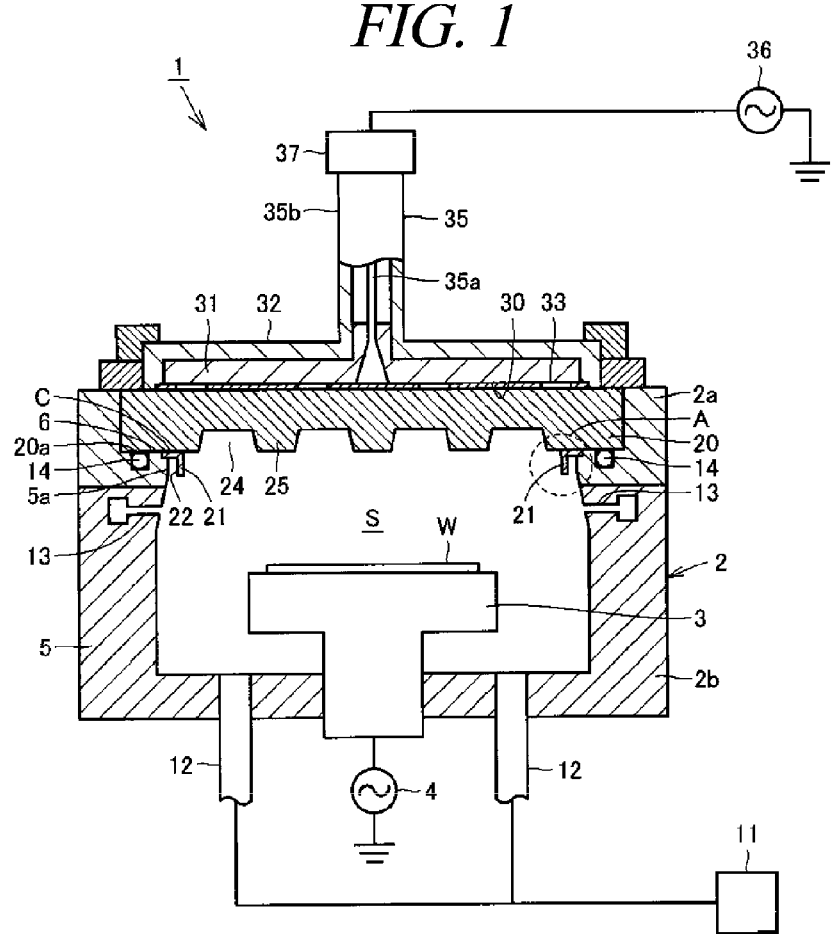
FIG. 1 is a longitudinal cross sectional view of a plasma processing apparatus in accordance with an embodiment of the present invention.

FIG. 1 is a longitudinal cross sectional view of a plasma processing apparatus in accordance with an embodiment of the present invention. In FIG. 1, a plasma processing apparatus 1 includes a cylindrical processing chamber 2 having a bottom and an open top. The processing chamber 2 is configured to accommodate a semiconductor wafer W as an example of a processing target object, and the semiconductor wafer W can be loaded into or unloaded from the processing chamber 2. The processing chamber 2 includes a lower chamber 2b and an upper chamber 2a having the open top, and the lower chamber 2b is grounded. Installed in a bottom portion of the processing chamber 2 is a susceptor 3 serving as a holding table configured to mount the semiconductor wafer W thereon. A high frequency bias signal is supplied to the susceptor 3 from an AC power supply 4 installed outside the processing chamber 2.

Gas exhaust pipes 12 are provided in the bottom portion of the processing chamber 2 so as to exhaust air from the inside of the processing chamber 2 by a gas exhaust unit 11 such as a vacuum pump. Further, provided in a sidewall of the processing chamber 2 is a gas inlet 13 through which a processing gas is supplied into the processing chamber 2 from a non-illustrated processing gas supply source.

A dielectric plate 20 having a substantially circular plate shape and made of a dielectric material such as quartz is supported on the open top of the upper chamber 2a of the processing chamber 2 via a sealing member 14 for securing airtightness so as to face the susceptor 3. Other kinds of dielectric materials may be used instead of the quartz. A processing space S is formed within the processing chamber 2 by the dielectric plate 20. The dielectric plate 20 has a circular shape when viewed from the top.

The dielectric plate 20 generates plasma on its bottom surface when a microwave is supplied to the dielectric plate 20. Recesses 24 or protrusions 25 are concentrically formed on the bottom surface of the dielectric plate 20. By providing the recesses 24 or the protrusions 25, there is generated a difference in the intensity of an electric field of the plasma generated on the bottom surface of the dielectric plate 20. Thus, plasma density above the semiconductor wafer W can be controlled.

A circular plate shaped slot antenna 30 is provided on the dielectric plate 20, and a wavelength shortening plate 31 and an antenna cover 32 enclosing the wavelength shortening plate 31 are provided on a top surface of the slot antenna 30. The slot antenna 30 is formed of a thin circular plate of copper plated with a conductive material such as Ag or Au, and is provided with a multiple number of slots arranged in a spiral shape or in a concentric circle shape.

A coaxial waveguide 35 is connected to the antenna cover 32, and the coaxial waveguide 35 has an internal conductor 35a and an external tube 35b. The internal conductor 35a is connected with the slot antenna 30. An end portion of the internal conductor 35a on the side of the slot antenna 30 has a conical shape, and, thus, the internal conductor 35a can propagate the microwave efficiently toward the slot antenna 30. A microwave of, e.g., about 2.45 GHz generated by a microwave supply device 36 is propagated to the dielectric plate 20 via a load matching unit 37, the coaxial waveguide 35, the wavelength shortening plate 31 and the slot antenna 30. An electric field is generated on the bottom surface of the dielectric plate 20 by the energy of the microwave, and the processing gas supplied into the processing chamber 2 through the gas inlet 13 is excited into plasma. As a result, a plasma process such as a film forming process or an etching process is performed on the semiconductor wafer W on the susceptor 3.

A ring-shaped protrusion member 21 (having a cross section of a reversed L-shape) having a cylindrical part and a flange part is provided on a peripheral portion of the bottom surface of the dielectric plate 20. To elaborate, the flange part is in contact with the bottom surface of the dielectric plate 20, and the cylindrical part is protruded downward. The protrusion member 21 is provided to prevent an abnormal electric discharge. The protrusion member 21 is configured as a separate member from the dielectric plate 20 to serve as a skirt portion. That is, there exists an interface between the bottom surface of the dielectric plate and the top surface of the flange part. The protrusion member 21 is made of a dielectric material such as quartz. Although the protrusion member 21 is made of the same material as the dielectric plate 20 in the present embodiment, different materials are also possible for the protrusion member 21 and the dielectric plate 20 as long as the protrusion member 21 is made of a dielectric material. A gap is provided between an outer peripheral surface 22 of the cylindrical part of the protrusion member 21 and an inner peripheral surface 5a of a sidewall of the processing chamber 2's upper chamber 2a.

When a plasma process is performed by the plasma processing apparatus 1 configured as described above, a semiconductor wafer W is mounted on the susceptor 3 within the processing chamber 2. The processing chamber 2 is evacuated through the gas exhaust pipes 12 while a processing gas is supplied into the processing chamber 2 through the gas inlet 13, so that the processing space S is regulated at a preset pressure. Then, a high frequency bias power is supplied to the semiconductor wafer W from the AC power supply 4, and a microwave is generated by the microwave supply device 36. The microwave is introduced into the processing chamber 2 via the dielectric plate 20, and an electric field is generated below the dielectric plate 20. As a result, the processing gas in the processing space S is excited into plasma, and various plasma processes such as an etching process, an asking process and a film forming process can be performed on the semiconductor wafer W by selecting the kind of the processing gas or the like.

In the plasma processing apparatus 1 in accordance with the embodiment of the present invention, the protrusion member 21 configured as a separate member from the dielectric plate 20 is provided on the peripheral portion of the bottom surface of the dielectric plate 20, and the bottom surface of the dielectric plate 20 is spaced apart from the inner peripheral surface 5a of the sidewall of the processing chamber 2's upper chamber 2a. With this configuration, electric field intensity in the vicinity of a contact point between the dielectric plate 20 and the upper chamber 2a of the processing chamber 2 for supporting the dielectric plate 20 can be reduced. Further, a microwave voltage propagated to the skirt portion can be reduced. Moreover, by reducing the thickness of the cylindrical part of the protrusion member 21, the microwave voltage propagated to the skirt portion can also be reduced.

Now, an effect of providing the protrusion member 21 having the above configuration, that is, an effect of providing the protrusion member 21 configured as a separate member from the dielectric member 20 will be explained.

Figure 2A:
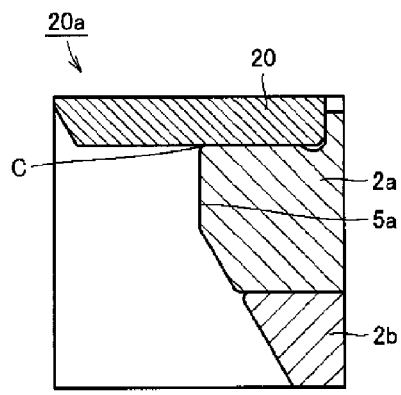
FIG. 2A is a partial cross sectional view illustrating a dielectric plate 20a without a skirt in the vicinity of a dashed line A of FIG. 1.
Figure 3A:
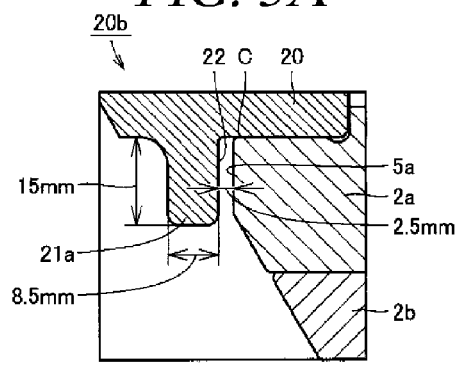
FIG. 3A is a partial cross sectional view of a dielectric plate 20b having a thick integrated skirt in the vicinity of the dashed line A of FIG. 1.
Figure 4A:
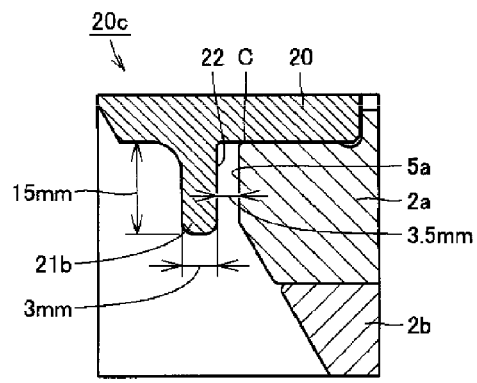
FIG. 4A is a partial cross sectional view of a dielectric plate 20c having a thin integrated skirt in the vicinity of the dashed line A of FIG. 1.

FIGS. 2A, 3A and 4A illustrate comparative examples to be compared with protrusion members 21, 21c and 21d of the plasma processing apparatus in FIGS. 5A, 6A and 7A to be described later in accordance with the embodiment of the present invention.

Figure 2B:
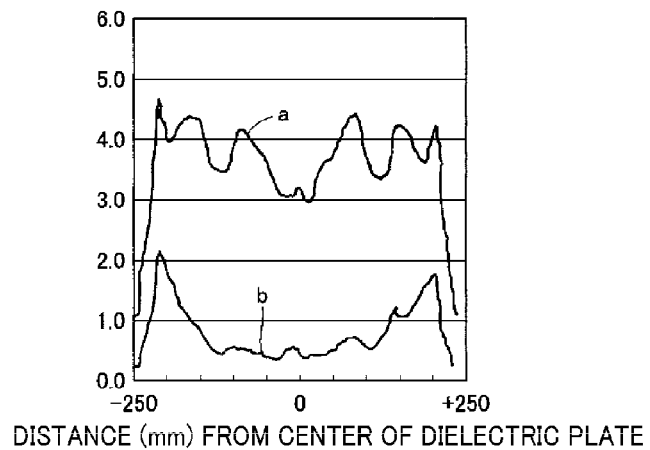
FIG. 2B is a graph showing radical light emission distribution a and ion light emission distribution b in case of Ar plasma on the dielectric plate 20a without a skirt.

FIG. 2A is a partial cross sectional view of a flat dielectric plate 20a (hereinafter, referred to as a "dielectric plate without a skirt") prepared by providing no protrusion on the dielectric plate 20. FIG. 2A shows the dielectric plate 20a in the vicinity of a dashed line A of FIG. 1. FIG. 2B is a graph showing radical light emission distribution a and ion light emission distribution b at the dielectric plate 20a without a skirt in case of Ar plasma.

Figure 3B:
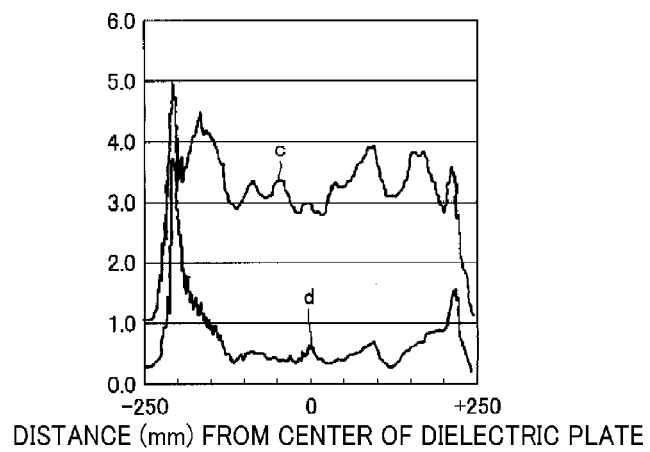
FIG. 3B is a graph showing radical light emission distribution c and ion light emission distribution d in case of Ar plasma on the dielectric plate 20b having the thick integrated skirt.

FIG. 3A is a partial cross sectional view of a dielectric plate 20b (hereinafter, referred to as a "dielectric plate having a thick integrated skirt") prepared by forming a protrusion 21a having a relatively thick cylindrical part as one body with the dielectric plate 20. FIG. 3A shows the dielectric plate 20b in the vicinity of the dashed line A of FIG. 1. FIG. 3B is a graph showing radical light emission distribution c and ion light emission distribution d at the dielectric plate 20b having a thick integrated skirt in case of Ar plasma.

Figure 4B:
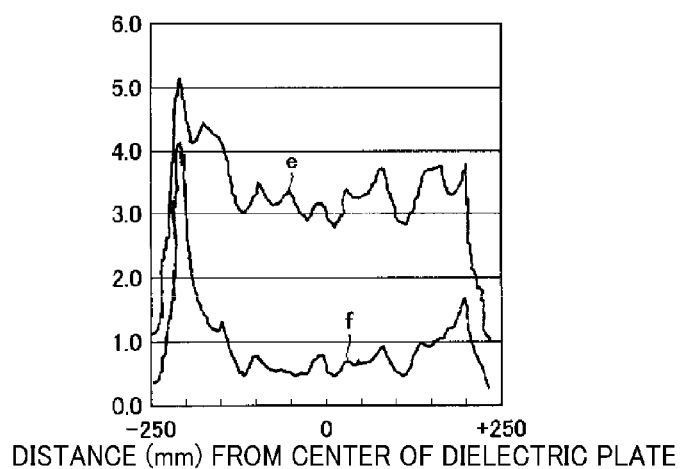
FIG. 4B is a graph showing radical light emission distribution e and ion light emission distribution f in case of Ar plasma on the dielectric plate 20c having the thin integrated skirt.

FIG. 4A is a partial cross sectional view of a dielectric plate 20c (hereinafter, referred to as a "dielectric plate having a thin integrated skirt") prepared by forming a protrusion 21b having a relatively thin cylindrical part as one body with the dielectric plate 20. FIG. 4A shows the dielectric plate 20c in the vicinity of the dashed line A of FIG. 1. FIG. 4B is a graph showing radical light emission distribution e and ion light emission distribution f at the dielectric plate 20c having a thin integrated skirt in case of Ar plasma.

In FIGS. 2A, 3A and 4A, illustration of the sealing member 14 shown in FIG. 1 is omitted. Further, in FIGS. 2B, 3B and 4B, "0" on a horizontal axis represents a center of the dielectric plate 20, while "+250" and "−250" indicate distances (mm) from the center of the dielectric plate 20 in two opposite directions. Further, a vertical axis represents electron density as a coefficient. Here, a pressure of an Ar gas is set to be about 50 mTorr.

As shown in FIG. 2A, in the dielectric plate 20a without a skirt, since a microwave electric field is strong at a position which is on the inner peripheral surface 5a of the sidewall of the upper chamber 2a and is adjacent to the dielectric plate 20, an electron temperature of plasma increases. To elaborate, since an interface exists between the dielectric plate 20 and the upper chamber 2a, a potential difference on the interface increases. Accordingly, ion irradiation energy to the interface increases, and, thus, high-energy plasma is generated by the strong electric field at a contact point C on the interface. In this example, as shown in FIG. 2B, the radical light emission distribution a of about 750 nm in case of an Ar gas shows a relatively large variation, and the ion light emission distribution b of about 480 nm in case of an Ar gas shows a highest peak value on the side of about −250 mm. As a result, a difference in plasma quality such as radical temperature, plasma density or electron temperature may be caused, resulting in non-uniform plasma processing.

Meanwhile, in the dielectric plate 20b having a thick integrated skirt shown in FIG. 3A, the protrusion 21a is formed as one body with the dielectric plate 20, and a protruding length L of a cylindrical part is set to be about 15 mm enough to cover a vertical part of the inner peripheral surface 5a of the sidewall; a thickness of the cylindrical part is set to be about 8.5 mm; and a gap between an outer peripheral surface of the cylindrical part of the protrusion 21a and the inner peripheral surface 5a of the sidewall of the upper chamber 2a is set to be about 2.5 mm. In this example, as compared to the dielectric plate 20a without a skirt shown in FIG. 2A, since the inner peripheral surface 5a of the sidewall of the upper chamber 2a and the bottom surface of the dielectric plate 20 can be spaced apart from each other by providing the protrusion 21a, electric field intensity can be reduced in the vicinity of a contact point C while a region around the contact point C is not directly exposed to the plasma. As can be seen from FIG. 3B, however, the radical light emission distribution c of about 750 nm in case of the Ar gas shows just a slight decrease. Further, in the ion light emission distribution d of about 480 nm in case of the Ar gas, a peak value on the side of about −250 mm shows no substantial change.

In the dielectric plate 20c having a thin integrated skirt shown in FIG. 4A, the protrusion 21b is formed as one body with the dielectric plate 20, and a protruding length L and a thickness of a cylindrical part are set to be about 15 mm and about 3.0 mm, respectively; and a gap between an outer peripheral surface of a cylindrical part of the protrusion 21b and the inner peripheral surface 5a of the sidewall of the upper chamber 2a is set to be about 3.5 mm. As compared to the protrusion 21a of FIG. 3A, the protrusion 21b in this example has a smaller thickness, and, thus, the gap between the inner peripheral surface 5a of the sidewall of the upper chamber 2a and the protrusion 21b is enlarged. In this way, by enlarging the gap between the protrusion 21b and the inner peripheral surface 5a of the sidewall of the upper chamber 2a by way of reducing the thickness of the protrusion 21b, electric field intensity in the vicinity of a contact point C can be further reduced. That is, as compared to FIG. 3B, in FIG. 4B, the radical light emission distribution e of about 750 nm in case of the Ar gas shows a slightly decreased peak value on the side of about −250 mm, while the ion light emission distribution d of about 480 nm in case of the Ar gas shows a greatly decreased peak value on the side of about −250 mm.

In the examples shown in FIGS. 3A and 4A, however, an abnormal electric discharge may be generated between the protrusion 21a (21b) and the inner peripheral surface 5a of the sidewall of the upper chamber 2a at a certain pressure range. The reason for this is deemed to be as follows. Since the protrusion 21a (21b) is configured as one body with the dielectric plate 20, a portion directly under the dielectric plate 20 and the protrusion 21a (21b) may have the same electric potential. A microwave power is excessively supplied to high-density plasma generated directly under the dielectric plate 20, and, thus, the abnormal electric discharge is generated between the outer peripheral surface of the cylindrical part of the protrusion 21a (21b) and the inner peripheral surface 5a of the sidewall of the upper chamber 2a, thereby consuming the microwave power.

Figure 5A:
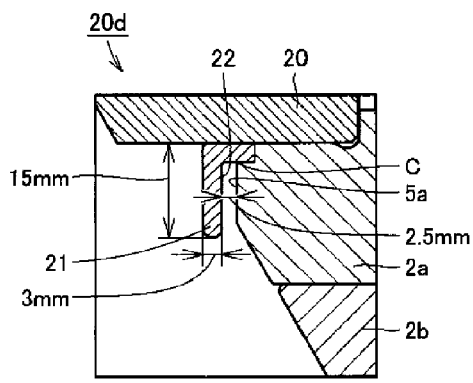
FIG. 5A is a partial cross sectional view of a first separate-type dielectric plate 20d in the vicinity of the dashed line A of FIG. 1.
Figure 6A:
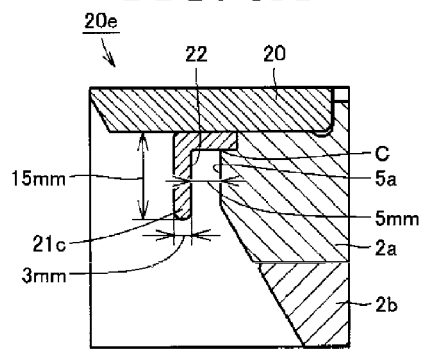
FIG. 6A is a partial cross sectional view of a second separate-type dielectric plate 20e in the vicinity of the dashed line A of FIG. 1.
Figure 7A:
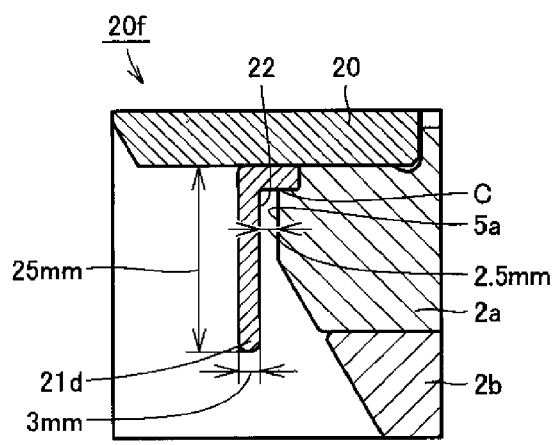
FIG. 7A is a partial cross sectional view of a third separate-type dielectric plate 20f in the vicinity of the dashed line A of FIG. 1.

Therefore, in accordance with an embodiment of the present invention, each of protrusion members 21, 21c and 21d is formed as a separate member from the dielectric plate 20, as illustrated in FIGS. 5A, 6A and 7A.

FIG. 5A is a partial cross sectional view of a dielectric plate 20d (hereinafter, referred to as a "first separate-type dielectric plate") prepared by forming a protrusion member 21 as a separate member from the dielectric plate 20. FIG. 5A shows the dielectric plate 20d in the vicinity of the dashed line A of FIG. 1. FIG. 5 is a graph showing radical light emission distribution g and ion light emission distribution h at the first separate-type dielectric plate 20 of FIG. 5A in case of Ar plasma.

Figure 6B:
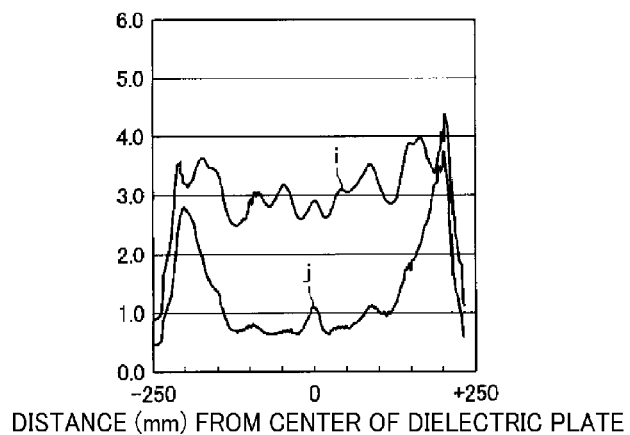
FIG. 6B is a graph showing radical light emission distribution i and ion light emission distribution j on the second separate-type dielectric plate 20e.

FIG. 6A is a partial cross sectional view of a dielectric plate 20e (hereinafter, referred to as a "second separate-type dielectric plate") prepared by enlarging a gap between the same protrusion member 21 as that of FIG. 5A and the peripheral surface 5a of the sidewall. FIG. 6A shows the dielectric plate 20e in the vicinity of the dashed line A of FIG. 1. FIG. 6B is a graph showing radical light emission distribution i and ion light emission distribution j at the second separate-type dielectric plate 20e of FIG. 6A.

Figure 7B:
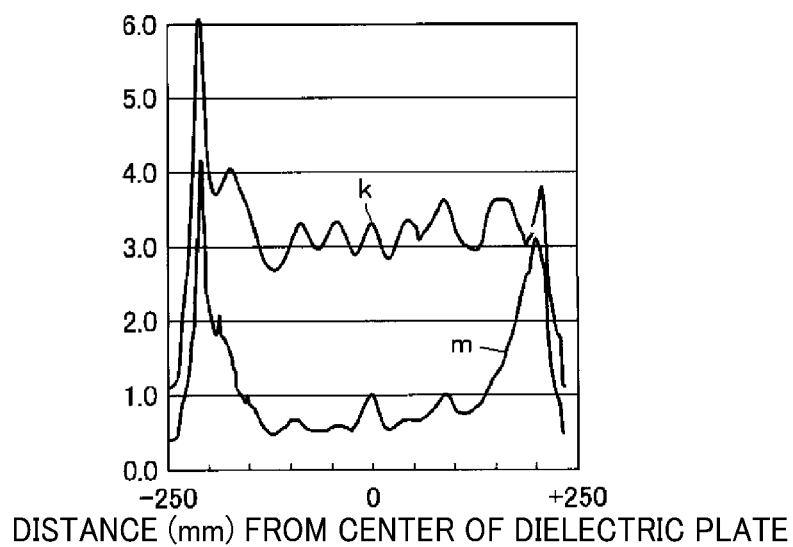
FIG. 7B is a graph showing radical light emission distribution k and ion light emission distribution m on the third separate-type dielectric plate 20f.

FIG. 7A is a partial cross sectional view of a dielectric plate 20f (hereinafter, referred to as "third separate-type dielectric plate") prepared by increasing a protruding length L of a cylindrical part of the same protrusion member 21 as that of FIG. 5A. FIG. 7A shows the dielectric plate 20f in the vicinity of the dashed line A of FIG. 1. FIG. 7B is a graph showing radical light emission distribution k and ion light emission distribution m at the third separate-type dielectric plate 20f of FIG. 7A.

Figure 5B:
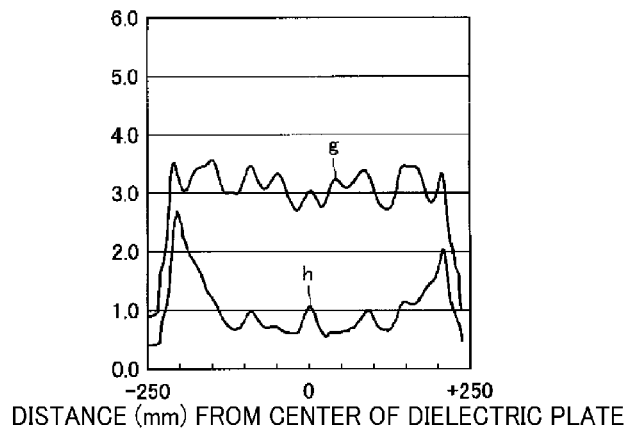
FIG. 5B is a graph showing radical light emission distribution g and ion light emission distribution h in case of Ar plasma on the first separate-type dielectric plate 20d.

Further, in FIGS. 5B, 6B and 7B, "0" on a horizontal axis represents a center of the dielectric plate 20, while "+250" and "−250" indicate distances (mm) from the center of the dielectric plate 20 in two opposite directions. Further, a vertical axis represents electron density as a coefficient.

As shown in FIG. 5A, the protrusion member 21 of the first separate-type dielectric plate 20d is formed as a separate member from the dielectric plate 20 and fixed on the dielectric plate 20. A protruding length L and a thickness of a cylindrical part are set to be about 15 mm and about 3.0 mm, respectively; and a gap between an outer peripheral surface of a cylindrical part of the protrusion member 21 and the inner peripheral surface 5a of the sidewall of the upper chamber 2a is set to be about 2.5 mm. In this way, by forming the protrusion member 21 as a separate member from the dielectric plate 20, an interface exists between the dielectric plate 20 and the protrusion member 21. Accordingly, a surface potential of the protrusion member 21 can be decreased. In this example, as shown in FIG. 5B, a variation of the radical light emission distribution g of about 750 nm in case of an Ar gas can be reduced, as compared to the FIGS. 2B, 3B and 4B. Although the ion light emission distribution h of about 480 nm in case of an Ar gas shows a certain peak value at a peripheral portion, the peak value can be reduced as compared to those in FIGS. 2B, 3B and 4B.

The protrusion member 21c of the second separate-type dielectric plate 20e shown in FIG. 6A is formed in the same manner as the protrusion member 21 of FIG. 5A excepting that a gap between an outer peripheral surface of a cylindrical part of the protrusion member 21c and the inner peripheral surface 5a of the sidewall of the upper chamber 2a is set to be about 5 mm. In this example, as shown in FIG. 6B, the radical light emission distribution i of about 750 nm in case of the Ar gas is reduced as compared to FIG. 5B. In the ion light emission distribution j of about 480 nm in case of the Ar gas, a variation on the side of about −250 mm is reduced, whereas a peak value on the side of about +250 mm is increased.

The protrusion member 21d of the third separate-type dielectric plate 20f shown in FIG. 7A is formed in the same manner as the protrusion member 21 of FIG. 5A excepting that a protruding length L of a cylindrical part is increased to about 25 mm. In this example, as shown in FIG. 7B, the radical light emission distribution k of about 750 nm in case of the Ar gas shows an increased peak value on the side of about −250 mm as compared to FIG. 5B, and the ion light emission distribution m of about 480 nm in case of the Ar gas shows increased peak values on the sides of about −250 mm and +250 mm as compared to FIG. 5B.

As can be clearly seen from the above comparison, in the ion light emission distribution of about 480 nm in case of the Ar gas, a peak value is highest on the side of about −250 mm in case of the dielectric plate 20a without a skirt shown in FIG. 2A and the dielectric plate 20b having a thick integrated skirt shown in FIG. 3A. A peak value decreases in the order of the third separate-type dielectric plate 20f shown in FIG. 7, the dielectric plate 20a not having a skirt shown in FIG. 2A, the first separate-type dielectric plate 20d shown in FIG. 5A, the second separate-type dielectric plate 20e shown in FIG. 6A and the dielectric plate 20c having a thin integrated skirt shown in FIG. 4A. Meanwhile, in the radical light emission distribution of about 750 nm in case of an Ar gas, a peak value is reduced in case of the first separate-type dielectric plate 20d shown in FIG. 5A and the second separate-type dielectric plate 20e shown in FIG. 6A.

As described above, an interface can be formed between the dielectric plate 20 and the protrusion member 21 (21c, 21d) by forming the protrusion 21 (21c, 21d) as a separate member from the dielectric plate 20. Accordingly, a surface potential of the protrusion member 21 (21c, 21d) can be reduced, and, thus, radical light emission distribution and ion light emission distribution can be decreased.

As illustrated in FIGS. 5A, 6A and 7A, by adjusting the gap between the outer peripheral surface of the protrusion member 21 (21c, 21d) and the inner peripheral surface 5a of the sidewall of the upper chamber 2a in the range of 2.5 mm≤d≤5 mm, by adjusting a thickness of the vertical part in the range of 3 mm≤t≤8 mm or by adjusting the protruding length L of the cylindrical part of the protrusion member 21d to cover the vertical part of the inner peripheral surface of the processing chamber's sidewall, electric field intensity at the peripheral portion of the dielectric plate 20 can be controlled.

Although the embodiments of the present invention has been described with reference to the accompanying drawings, the present invention is not limited thereto, and various changes and modifications can be made without departing from the scope of the present invention.

INDUSTRIAL APPLICABILITY

The plasma processing apparatus in accordance with the present invention is capable of performing a plasma process such as an etching process or a film forming process on a semiconductor wafer within a processing chamber.

What is claimed is:

1. A plasma processing apparatus comprising:
a processing chamber having a top opening;
a holding table that holds a processing target substrate within the processing chamber;
a dielectric plate provided to close the top opening of the processing chamber and configured to face the holding table;
an antenna that supplies a microwave to the dielectric plate and generates plasma on a bottom surface of the dielectric plate; and
a ring-shaped protrusion member formed as a separate member from the dielectric plate and provided at a peripheral portion of the bottom surface of the dielectric plate while a gap is provided between an inner surface of a sidewall of the processing chamber and the protrusion member, the protrusion member being configured to suppress an abnormal electric discharge between the inner surface of the sidewall of the processing chamber and the protrusion member,
wherein the protrusion member is made of a dielectric material
an interface is formed between the dielectric plate and the protrusion member, and the protrusion member has a cylindrical part protruded downward; and a flange part extended outward from an upper end of the cylindrical part in a diametric direction and in contact with the peripheral portion of the bottom surface of the dielectric plate, and
wherein the processing chamber has an upper chamber and a lower chamber,
the upper chamber has a vertical part having a preset height and a non-vertical part, and
a protruding length of the cylindrical part is substantially the same as the preset height so that the cylindrical part covers the vertical part of the upper chamber without covering the lower chamber.

2. The plasma processing apparatus of claim 1, wherein a distance d between an outer surface of the cylindrical part and the inner surface of the sidewall of the processing chamber is set to be in a range of 2.5 mm≤d≤5 mm.

3. The plasma processing apparatus of claim 1, wherein a thickness t of the cylindrical part is set to be in a range of 3 mm≤t≤8 mm.

4. The plasma processing apparatus of claim 1, wherein a recess or a protrusion is concentrically provided with respect to a center of the dielectric plate on the bottom surface of the dielectric plate.

* * * * *